(12) United States Patent
Lee et al.

(10) Patent No.: US 10,679,723 B1
(45) Date of Patent: Jun. 9, 2020

(54) DIRECT MEMORY CHARACTERIZATION USING PERIPHERY TRANSISTORS

(71) Applicant: PDF Solutions, Inc., Santa Clara, CA (US)

(72) Inventors: Dong Kyu Lee, Santa Clara, CA (US); Kelvin Yih-Yuh Doong, Zhubei (TW); Tuan Pham, Santa Clara, CA (US); Klaus Schuegraf, Santa Clara, CA (US); Christoph Dolainsky, Santa Clara, CA (US); Huan Tsung Huang, Santa Clara, CA (US); Hendrik Schneider, Santa Clara, CA (US)

(73) Assignee: PDF SOLUTIONS, INC., Santa Clara, CA (US)

( * ) Notice: Subject to any disclaimer, the term of this patent is extended or adjusted under 35 U.S.C. 154(b) by 0 days.

(21) Appl. No.: 16/211,545

(22) Filed: Dec. 6, 2018

(51) Int. Cl.
| | |
|---|---|
| *G11C 29/56* | (2006.01) |
| *H01L 23/528* | (2006.01) |
| *H01L 27/11526* | (2017.01) |
| *H01L 21/66* | (2006.01) |
| *G11C 16/14* | (2006.01) |
| *H01L 27/11573* | (2017.01) |
| *G06F 30/394* | (2020.01) |
| *G06F 30/333* | (2020.01) |

(52) U.S. Cl.
CPC ...... *G11C 29/56016* (2013.01); *G06F 30/394* (2020.01); *G11C 16/14* (2013.01); *H01L 22/14* (2013.01); *H01L 23/528* (2013.01); *H01L 27/11526* (2013.01); *H01L 27/11573* (2013.01); *G06F 30/333* (2020.01)

(58) Field of Classification Search
CPC . G11C 29/56016; G11C 16/14; G06F 30/394; G06F 30/333; H01L 27/11573; H01L 27/11526; H01L 23/528; H01L 22/14
See application file for complete search history.

(56) References Cited

U.S. PATENT DOCUMENTS

| | | | |
|---|---|---|---|
| 7,142,455 B1 * | 11/2006 | Lee | G11C 11/5628 365/185.19 |
| 8,627,188 B2 * | 1/2014 | Weingarten | G06F 11/1068 365/185.09 |
| 2006/0273809 A1 * | 12/2006 | Miller | G01R 31/2889 324/750.05 |

* cited by examiner

*Primary Examiner* — Bac H Au
(74) *Attorney, Agent, or Firm* — Pillsbury Winthrop Shaw Pittman LLP

(57) ABSTRACT

Disclosed is a system and method for performing direct memory characterization of memory cells in a memory array using peripheral transistors. A memory array is fabricated using a mask layer defining routing for a set of first stage periphery transistors electrically connected to the word lines of the memory array. A revised mask is used for defining a different routing for a set of second stage periphery transistors including different characteristics than the first stage periphery transistors. Testing is conducted by applying a simulated Erase signal to the nonvolatile memory cells and determining which cells are erased. Based on this test, certain characteristics of the first and/or second stage periphery transistors can be identified that provide improved conditions for the nonvolatile memory cells. A product chip can be manufactured using modified versions of the first stage periphery transistors that incorporate the characteristics that provide the improved condition(s).

20 Claims, 9 Drawing Sheets

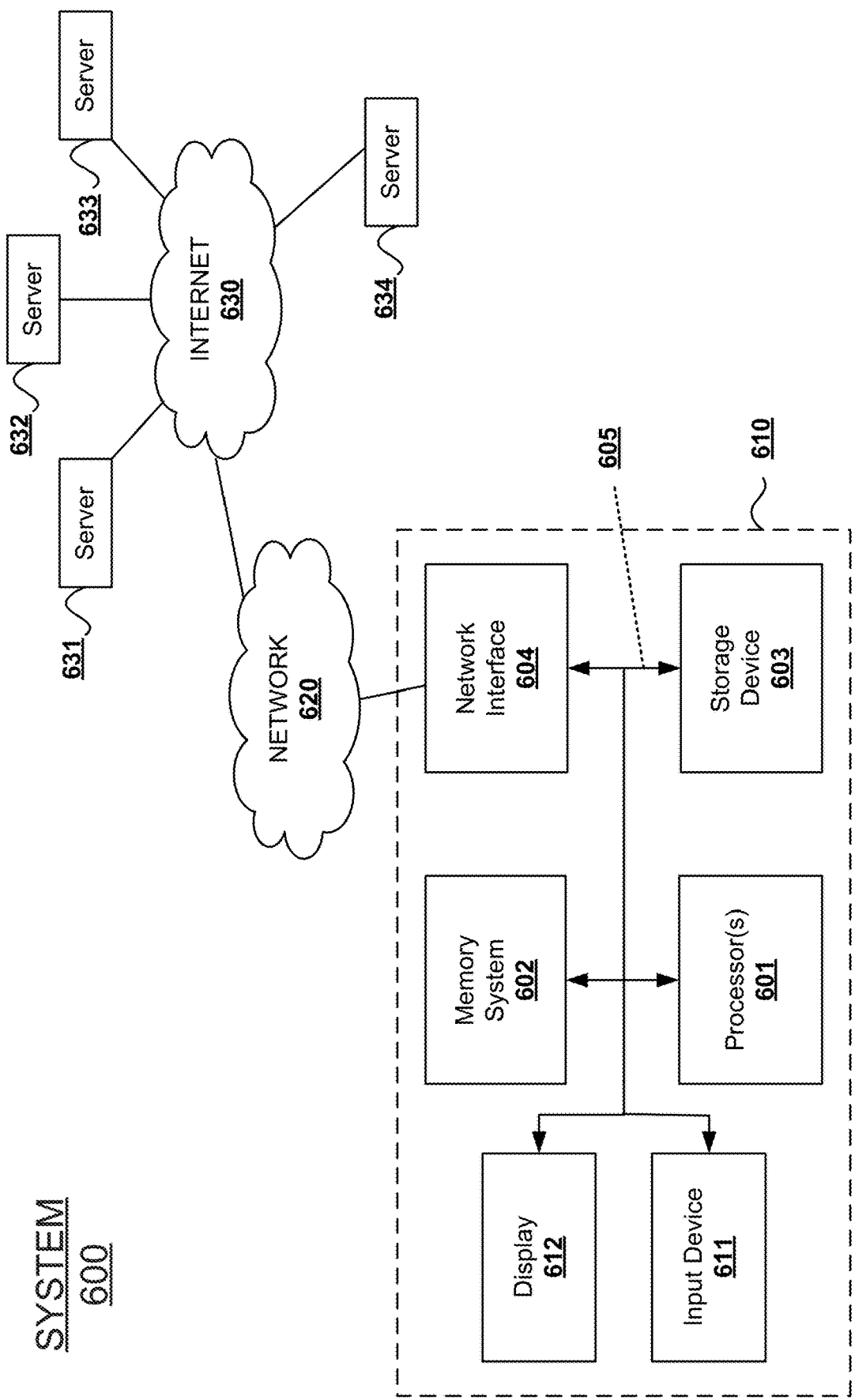

DIRECT MEMORY CHARACTERIZATION USING PERIPHERY TRANSISTORS

TECHNICAL FIELD

This disclosure relates generally to testing and development of nonvolatile memory arrays, and more particularly to improved techniques for characterizing nonvolatile memory cells in a memory array using one or more stages of periphery transistors.

BACKGROUND

To increase memory density, memory products are conventionally formed as an array structure consisting of a number of single memory cells sharing the same word line ("WL") and/or the same bit line ("BL"). FIG. 1 depicts a block diagram of an example nonvolatile memory array configured with a plurality of WL pads and BL pads in a direct probing characterization vehicle used for testing purposes according to the prior art. Prior art memory array 100 may be a nonvolatile memory array. In the diagram, prior art memory array 100 is shown comprising a plurality of WLs 102 and a plurality of BLs 104 arranged in a cross-point configuration, wherein each memory cell 106 is located at one of the intersections of the WLs 102 and BLs 104, with a corresponding set of WL pads 103 and BL pads 105 disposed around the periphery of the memory array 100. The WL pads 103 and/or BL pads 105 can be used for receiving a test probe device that can perform testing on the memory cells of the memory array according to one or more testing algorithms as would be appreciated by persons of ordinary skill in the art. In the diagram, the WLs 102 and BLs 104 are directly connected to the probing pads 103 and 105, respectively. Memory array 100 further includes a set of select transistors 107 that are used to gate signals driven out onto the BLs 104 of the array.

To access a specific memory cell, voltage bias levels are applied to the memory cell during an appropriate time period. When this happens, neighboring memory cells that share either the same WL and/or BL are known to suffer unwanted stress conditions. This can disturb the neighboring cells, and in some cases cause the value stored in the memory cell to change to an incorrect value (e.g., the stored bit value in the memory cell can be flipped from a zero to a one or from a one to a zero. Disturbance is the term of art used to describe such unwanted stress conditions from the array structure during operations such as writing data to the memory cells (Program), erasing data (Erase) stored in the memory cells, or reading data (Read) from the memory cells.

Nonvolatile memories such as for example floating gate memories, use high impedance conditions ("Hi-Z") across the memory cell transistors of the neighboring memory cells to improve immunity to such disturbance. In floating gate memories, Program operations inject electrons from the memory cell transistor bulk or channel into the charge trap layer (floating gate), whereas Erase operations pull electrons out of the charge trap layer back into the bulk (or channel) of the memory cell transistor. The difference between the erased memory cells and erase-inhibited neighboring memory cells is the gate potential of the memory cell transistor.

For example, Flash memory uses a high gate-to-channel (or well or bulk) electric field across the cell transistor of the memory cell to Erase a memory cell or block of cells. After a Program operation the selected memory cells or block of cells should be erased and neighboring memory cells should not be erased. The electric potential gap between the gate and bulk or channel of the cell transistor should be high for the erased memory cells and should be held close to zero volts for the erase-inhibited neighboring memory cells. Therefore, in prior art solutions the operating conditions of the memory cells should be carefully selected to avoid inducing a high electric field in the neighboring memory cells that are not being accessed, but that share either the same WL or BL. This can help prevent the bit values (zero or one) programmed into the neighboring memory cells from being adversely affected during any Program, Erase and/or Read operations.

In general, floating gate nonvolatile memories use Hi-Z conditions for the neighboring memory cells to counteract the electric field disturbance that may arise across the neighboring memory cell as a result of accessing the target memory cells. To cancel out the electric field across the gate and channel of the neighboring memory cell transistors, prior art solutions apply a reversed bias having the same magnitude between the gate voltage and the channel (or well or bulk) voltage during a specified time period to inhibit erasing the neighboring memory cells. In prior art solutions, this is accomplished using sophisticated circuit design techniques which require additional circuits and precise synchronization.

Such circuit techniques are employed in conventional methods to prevent the gate potential of the erase-inhibited neighboring memory cells from dropping too low. If the gate potential of the erase-inhibited memory cells drops too low, the reverse bias applied across the neighboring memory cells may not be high enough to inhibit it from flipping to an incorrect value, causing a failure in the memory array. The root cause of such failure stems from the characteristics of the transistors that drive Program, Erase or Read signals out onto the nonvolatile memory cells of the memory array. The gate potential of the neighboring memory cells can become too low due to high leakage current from the transistors that drive signals out to the memory cells and/or high parasitic capacitance coming from the driving transistors. If the drain (or source) of driving transistors are leaky or the gate capacitance and/or junction capacitance of the driving transistors is high, the memory cell gate potential becomes too low and the memory cells are accordingly susceptible to being inadvertently erased.

Additionally, during testing of the memory array, the gate capacitance and/or junction capacitance of the memory cell transistors can become too low because of the high parasitic loading capacitance stemming from the testing device (e.g., test probe) structure, routing, and/or pad probing.

SUMMARY

In one aspect, the techniques described in this disclosure are directed to a system and method in a memory array fabricated on a semiconductor substrate comprising a plurality of nonvolatile memory cells electrically connected with a plurality of word lines and bit lines arranged in the memory array such that each memory cell is disposed at an intersecting one of the word lines and bit lines in a cross-point or similar configuration. The memory array can be fabricated on the semiconductor substrate using a mask layer that defines a routing configuration wherein each word line is electrically connected with one of a plurality of first stage periphery transistors. The mask layer can be revised (or a special mask layer constructed) to define a second routing configuration different from the first routing configuration for electrically connecting a group of one or more of the word lines of the memory array with one of a plurality of second stage periphery transistors that include one or more characteristics different from the corresponding characteristics of the first stage periphery transistors. The first and second stage periphery transistors each include a gate region electrically connected with a gate pad and a drain (or source) region electrically connected with a drain (or source) pad in the memory array. The gate and drain (or source) pads can be used for connecting with a testing probe device for performing testing operations on the nonvolatile memory cells of the memory array.

This aspect further includes conducting one or more tests based on applying the test probe to one or more of the gate pads and drain (or source) pads of the plurality of first and second stage periphery transistor. The test may include (1) applying a simulated erase signal to the nonvolatile memory cells on the word lines of the memory array via the first and second stage periphery transistors; and (2) determining which of the nonvolatile memory cells are erased during the test. Based on the results of the test, one or more characteristics of the first and/or second stage periphery transistors can be identified that provide one or more improved conditions for the nonvolatile memory cells in the memory array.

A product chip containing the memory array of nonvolatile memory cells can then be manufactured using modified versions of the plurality of first stage periphery transistors that each incorporate the identified characteristics providing the improved condition(s) for the nonvolatile memory cells.

The improved conditions may include reduced gate capacitance and/or junction capacitance level for the modified periphery transistors and the identified characteristics may be adapted to reduce the gate capacitance and/or junction capacitance level associated with the modified periphery transistors. The improved conditions may also include reduced leakage currents from the modified periphery transistors and the identified characteristics may be adapted to reduce the leakage currents associated with the modified periphery transistors.

BRIEF DESCRIPTION OF THE DRAWINGS

The above aspects and other features of the innovative techniques described in this disclosure will become apparent to those skilled in the art upon review of the following description in conjunction with the accompanying figures, wherein:

FIG. 6 depicts an example overview block diagram of a system upon which the embodiments described in this disclosure may be implemented.

DETAILED DESCRIPTION OF THE EMBODIMENTS

Throughout this description numerous details are set forth in order to provide a thorough understanding of the various embodiments described in this disclosure, which are provided as illustrative examples to enable those of skill in the art to practice such embodiments. It will be apparent to those skilled in the art, however, that the techniques described in this disclosure may be practiced without some of these specific details; or in other instances, well-known structures and devices may be shown in block diagram form to avoid obscuring the principles and features described in this disclosure. The drawings and examples provided are not intended to limit the scope to any single embodiment, as other embodiments are possible by way of interchanging of elements.

Where certain elements of these embodiments can be partially or fully implemented using known components, only those portions of such known components that are necessary for an understanding of the embodiments will be described, and detailed descriptions of other portions of such known components will be omitted so as not to obscure the description. Moreover, applicants do not intend for anything in the specification or claims to be ascribed an uncommon or special meaning unless explicitly set forth as such. Further, the scope of the described embodiments encompasses present and future known equivalents of the components referred to herein by way of illustration.

The techniques described in this disclosure are directed to a method for characterizing nonvolatile memory cells of a memory array using one or more stages of periphery transistors located adjacent to the memory array to find the most suitable periphery transistor conditions. In memory arrays there are logic gates, such as NAND, NOR, XOR, XNOR, etc., built around the array and used to drive signals onto the memory cells in the memory array via the WLs or BLs for performing Program, Erase and Read operations. These logic gates may comprise various circuit elements such as address decoders, sense amplifiers, WL drivers, BL drivers, etc., which may be arranged in several logic stages and may comprise several different types and sizes of transistors that include different transistor characteristics (e.g., width, length and/or doping profile, etc.). The transistors for these logic stages are referred to in the art as "periphery transistors" since they are physically disposed around the periphery of a memory array.

Figure 1:
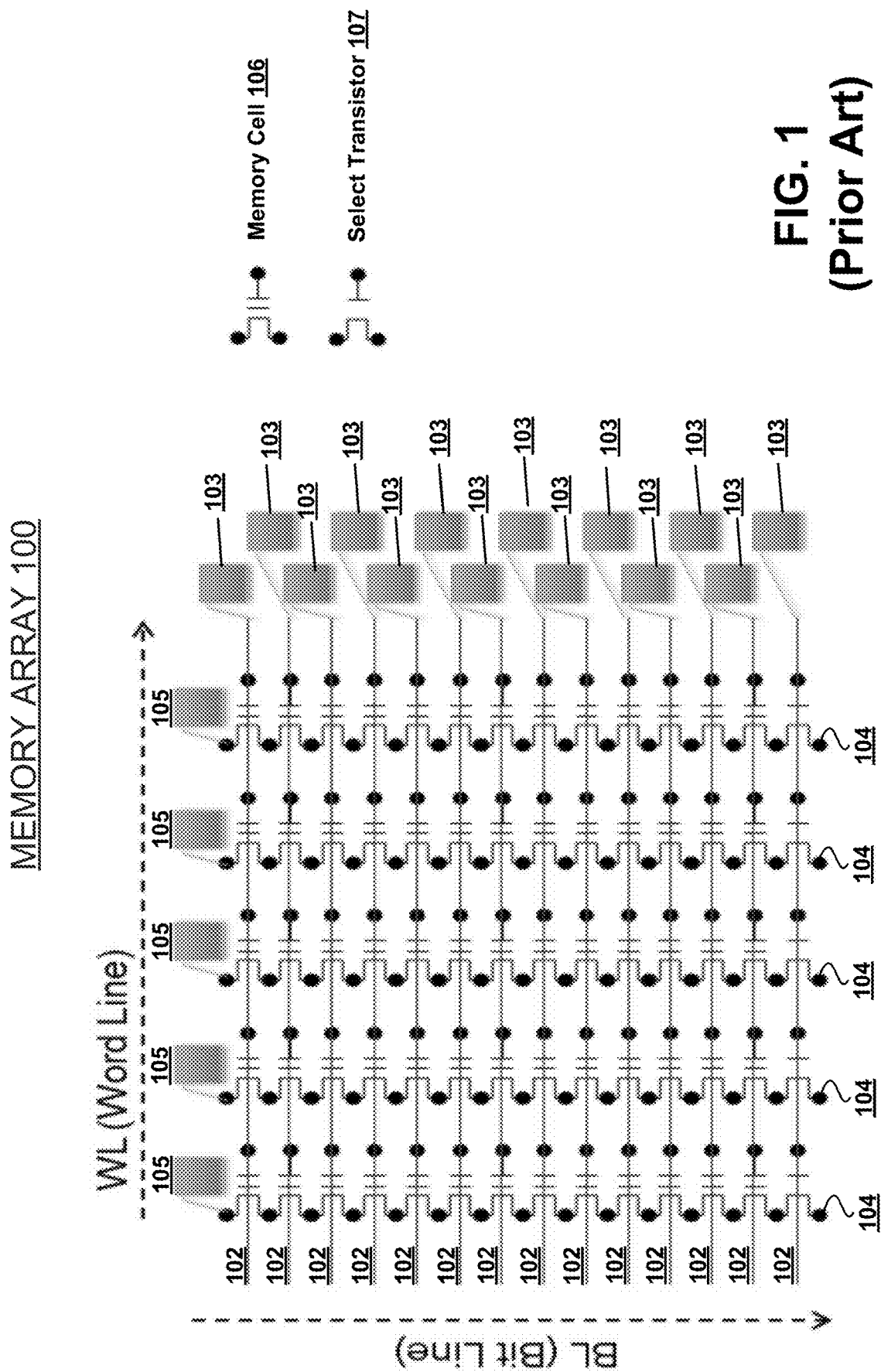
FIG. 1 depicts a block diagram of an example nonvolatile memory array configured with a plurality of WL pads and BL pads used for testing purposes in accordance with the prior art.
Figure 2A:
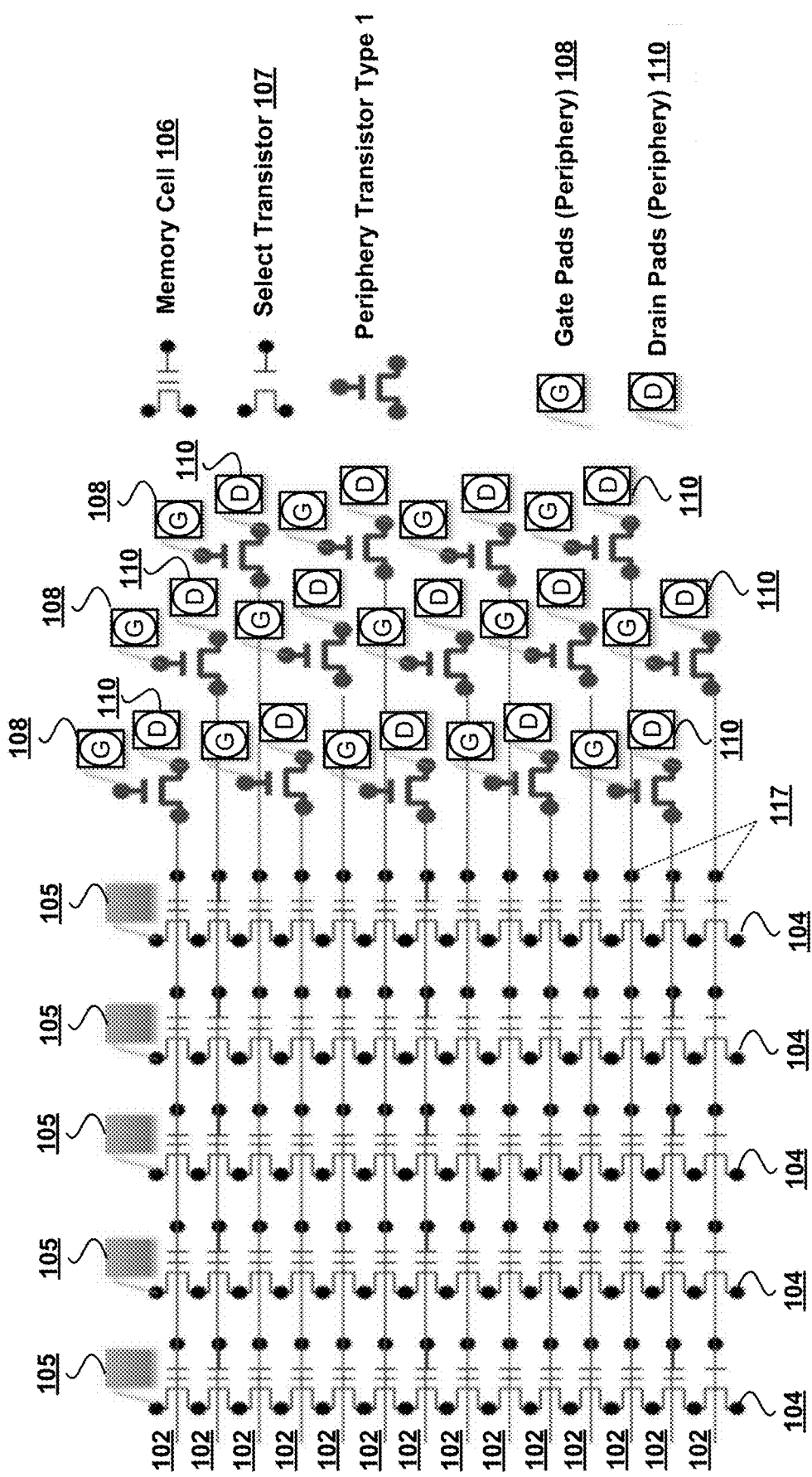
FIG. 2A depicts a conceptual diagram of an example embodiment of a memory array having WL pads replaced by a plurality of periphery transistors for testing purposes in accordance with the techniques described in this disclosure.

FIG. 2A depicts a conceptual diagram of an example embodiment of a memory array having WL pads replaced by a plurality of periphery transistors for testing purposes. At the outset, it should be noted that although certain elements may be depicted as separate components, in some instances one or more of the components may be combined into a single device or system. Likewise, although certain functionality may be described as being performed by a single element or component within the system, the functionality may in some instances be performed by multiple components or elements working together in a functionally coordinated manner.

In addition, hardwired circuitry may be used independently or in combination with software instructions to implement the techniques described in this disclosure. The embodiments described in this disclosure are not limited to any specific combination of hardware or software. For example, the described functionality may be performed by custom hardware components containing hardwired logic for performing operations, by general-purpose computer hardware containing a memory having stored thereon programmed instructions for performing operations, or by any combination of computer hardware and programmed components. The embodiments may also be practiced in distributed computing environments, such as in a private or public cloud network, where operations may be performed by remote data processing devices or systems that are in communication with one another through one or more wired or wireless networks.

In FIG. 2A, the WLs 102 of memory array 200A are connected to the source terminals of the periphery transistors of Type 1. The Type 1 periphery transistors may include, for example, the transistors that drive signals out onto the gate terminals 117 of the memory cells 106. In the illustrated embodiment, each of the Type 1 periphery transistors are shown as including a gate probe pad 108 and a drain probe pad 110. In one aspect, the Type 1 periphery transistors perform the function of isolating the WLs 102 from the gate probe pads 108 and the drain probe pads 110 so that the parasitic capacitance of the test probe does not reach the WLs 102 when connected with the probe pads 108 and 110. The parasitic capacitance on the WLs 102 as seen by the gate terminals 117 of the memory cells 106 such a configuration is much smaller than the parasitic capacitance that would be seen on the WLs 102 from the testing probe structure, routing and/or WL or BL probing pads that are replaced by connections to the periphery transistors.

In addition, in a product chip the characteristics of the different periphery transistors can be different due to their physical placement in the chip and due to interference from surrounding componentry (e.g., neighboring effects, local layout effects, etc.). The techniques described herein are adapted to optimize the transistor characteristics of the such periphery transistors. The periphery transistors used for the innovative techniques of this disclosure can be used from the periphery transistors (such as Type 1 shown in the figure) in a memory array of an existing product chip. The existing periphery transistors of various stages in an existing memory array operate for their own purposes in the product chip. The described techniques are adapted to change the routes of these existing periphery transistors to connect them with the gate terminals 117 of the memory cells 106 in the memory array 200A for testing. This may be accomplished using a different mask layer (generally a metal mask) to provide the routes to the connections regardless of their original function(s) inside the product chip.

The periphery transistors may include logic stages built around the memory array that are used to drive signals onto the array (e.g., driving transistors for the WLs and/or BLs of the memory array). The periphery transistors may also include other periphery transistors at different stages and having different functions as will be discussed in more detail below. In other embodiments, the periphery transistors of Type 1 can be specially constructed on a test vehicle specifically designed for testing.

When using the periphery transistors already on an existing product chip, a mask revision or special mask—such as those used in, for example, Direct Probing Characterization Vehicle ("DPCV") solutions—may be used to revise the metal routing to connect the existing periphery transistors to the appropriate one of the memory cells in the memory array for testing. So while there may not be complete freedom for the circuit designer to select transistor sizes for the existing periphery transistors on a particular memory array 200A in a product chip, there are many different types of periphery transistors already available that can be connected with the memory cells 106 via the WLs 102 and/or BLs 104 of the memory array using a revised mask or special mask, which is different from the mask used for connecting the WLs and BLs to the original driving transistors in the product chip.

The revised or special mask layer may change the routes on the original product chip to connect some or all the WLs 102 and/or BLs 104 to other sets of periphery transistors (of different stages and different types, sizes, etc.) to obtain a full set of data upon which the testing algorithm can evaluate the periphery transistors and determine the most suitable transistor characteristics to mitigate the leakage currents and gate capacitance and/or junction capacitance issues seen at the gate terminals 117 of the memory cells 106. In at least certain embodiments, only some of the routes are changed and some of the original routes are left in place so that the testing algorithm can provide a dataset to compare the relative characteristics of the original driving transistor stages with the newly connected periphery transistor stages using the modified or special mask layer. There are generally many different sets of stages of periphery transistors that already exist in a product chip with many different functions and characteristics that may not be related to testing. The disclosed techniques utilize such transistor logic stages for the evaluation purposes regardless of their original function inside the product chip.

Figure 2B:
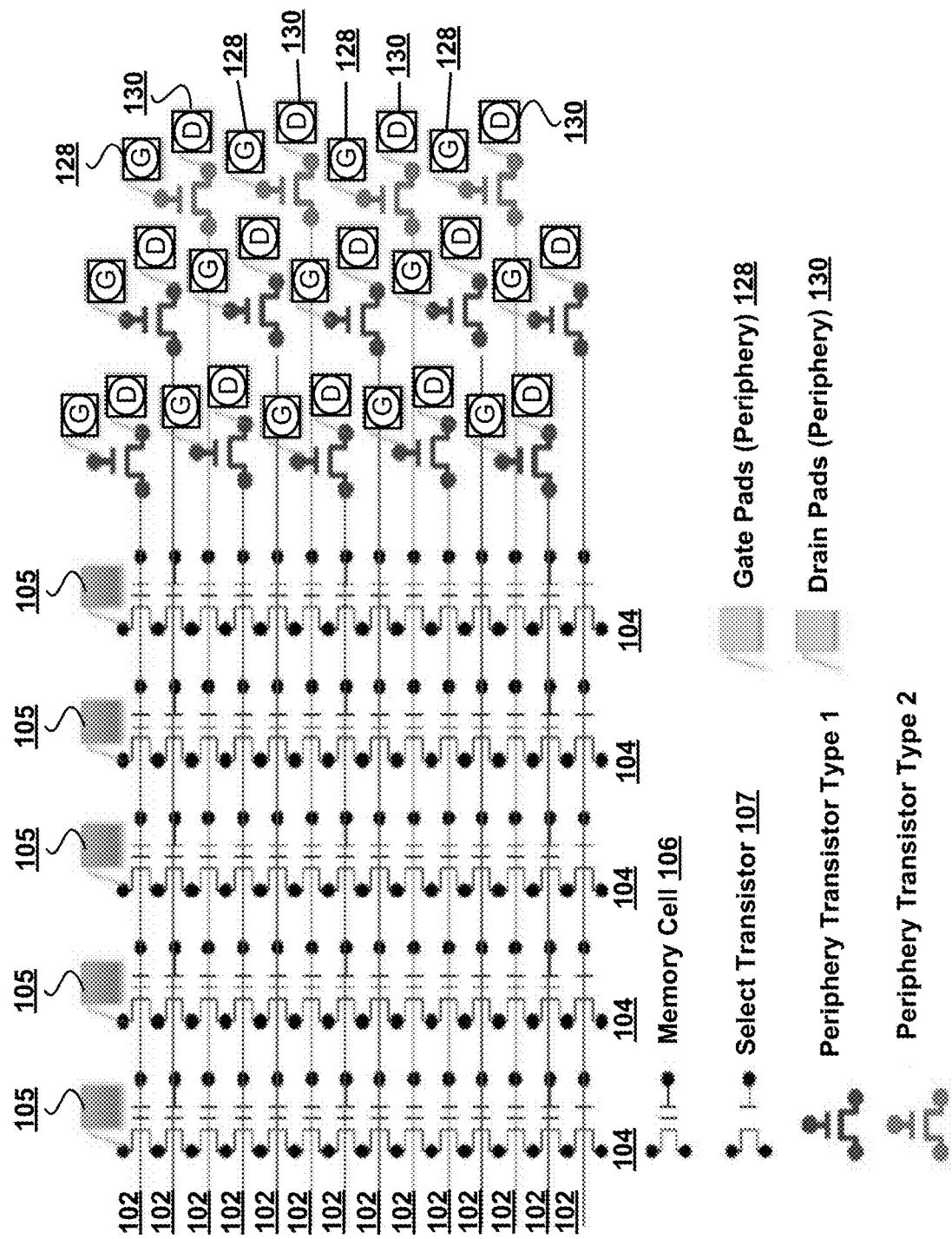
FIG. 2B depicts a conceptual diagram of an example embodiment of a memory array having WL pads replaced by a plurality of periphery transistors of different types for testing purposes in accordance with the techniques described in this disclosure.

The disclosed techniques may utilize different sets of periphery transistors for testing a set of memory cells 106 to ensure the logic stages of any neighboring memory cells are not improperly flipped to an incorrect value during Erase operations. For example, FIG. 2B depicts a conceptual diagram of an example embodiment of a memory array having WL pads replaced by a plurality of periphery transistors of different types for testing purposes in accordance with the techniques described in this disclosure. Each of the different types of tests can be run on the memory array 200B using a testing algorithm and testing probe device(s) that is configured to connect with the gate pads 128 and/or drain pads 130 of the periphery transistors of both Type 1 and Type 2 as shown in the figure. The different periphery transistors (e.g., Type 1 and Type 2 as shown in FIG. 2B) may be used together with one or more testing algorithms to interrogate the memory array 200B and perform the testing operations using each of a plurality of different sets of periphery transistors Type 1 and Type 2 to discover the transistor characteristics (such as transistor width, length, width-to-length ratio, doping profile, etc.) that provide the most suitable conditions for the memory cells 106 in the memory array 200B from the perspective of reducing gate capacitance and/or junction capacitance and leakage currents on the WLs 102 as discussed previously. The testing can be performed by placing the test probe on the gate pads 128 and/or drain pads 130 of the periphery transistors and by using a testing algorithm. In other aspects, the configuration of the source or drain of the periphery transistors may be used interchangeably for testing depending on the particular implementation.

The characteristics for the driving transistors that provide the most suitable conditions for the memory cells 106 may be ascertained based on the results of the testing. These results can then be used to optimize the characteristics of the driving transistors that drive the Program, Erase or Read signals out onto the memory cells 106 in the memory array 200B, for example, by revising the transistor characteristics such as transistor widths, lengths, width-to-length ration, and/or doping profiles, etc., of the driving transistors. These characteristics can then be used in manufacturing the final product. In particular, the driving transistors can be designed to minimize leakage currents and parasitic capacitances for the various different transistor sizes that were discovered during testing. In sum, based on the evaluation results, the Type 1 transistors can be changed to a new Type 1 transistor having characteristics that improve the condition of the memory cells in the memory array.

Figure 3A:
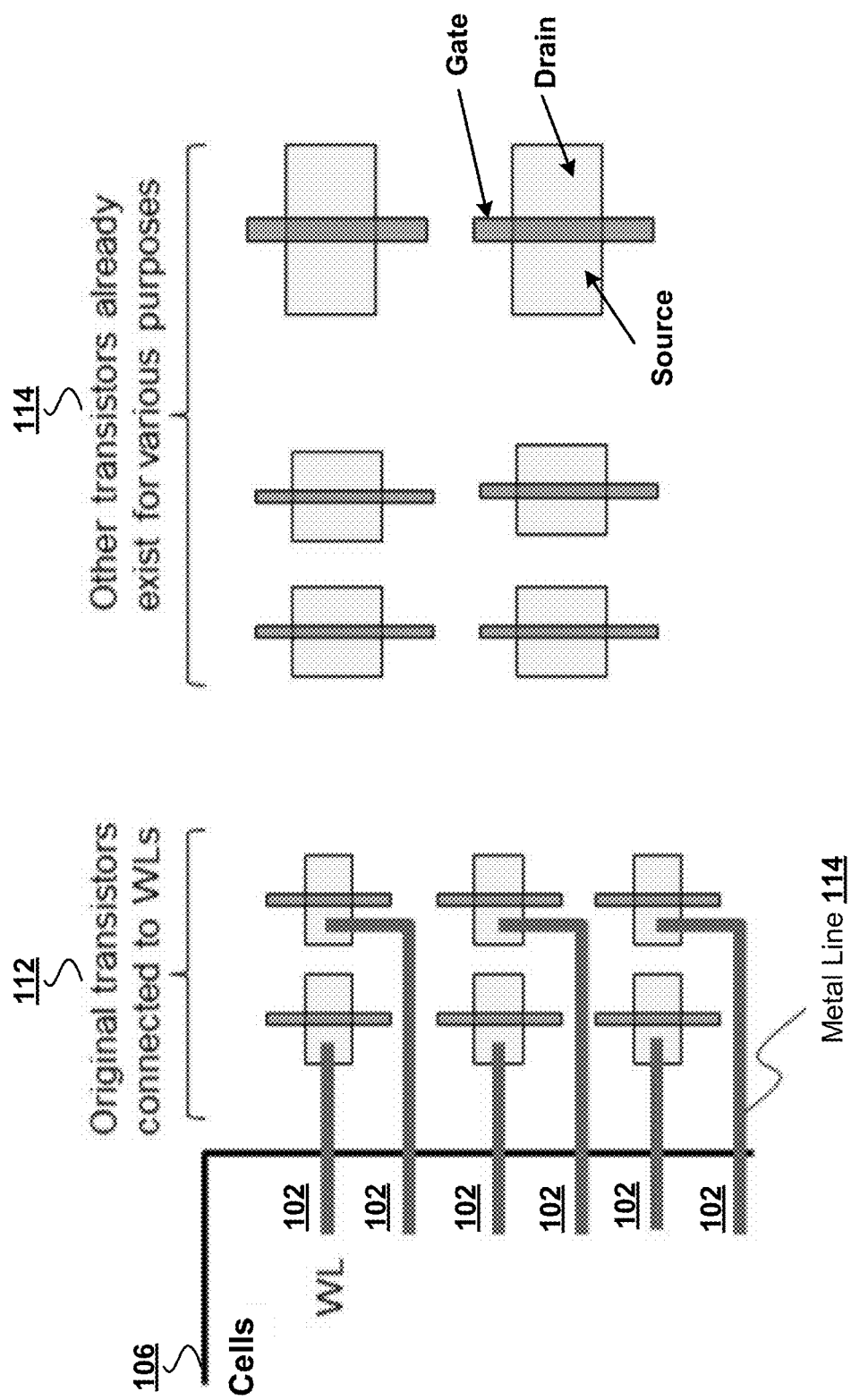
FIGS. 3A-3C depict an example embodiment of a process for direct memory characterization using a plurality of periphery transistors stages for testing purposes in accordance with the techniques described in this disclosure.
Figure 3B:
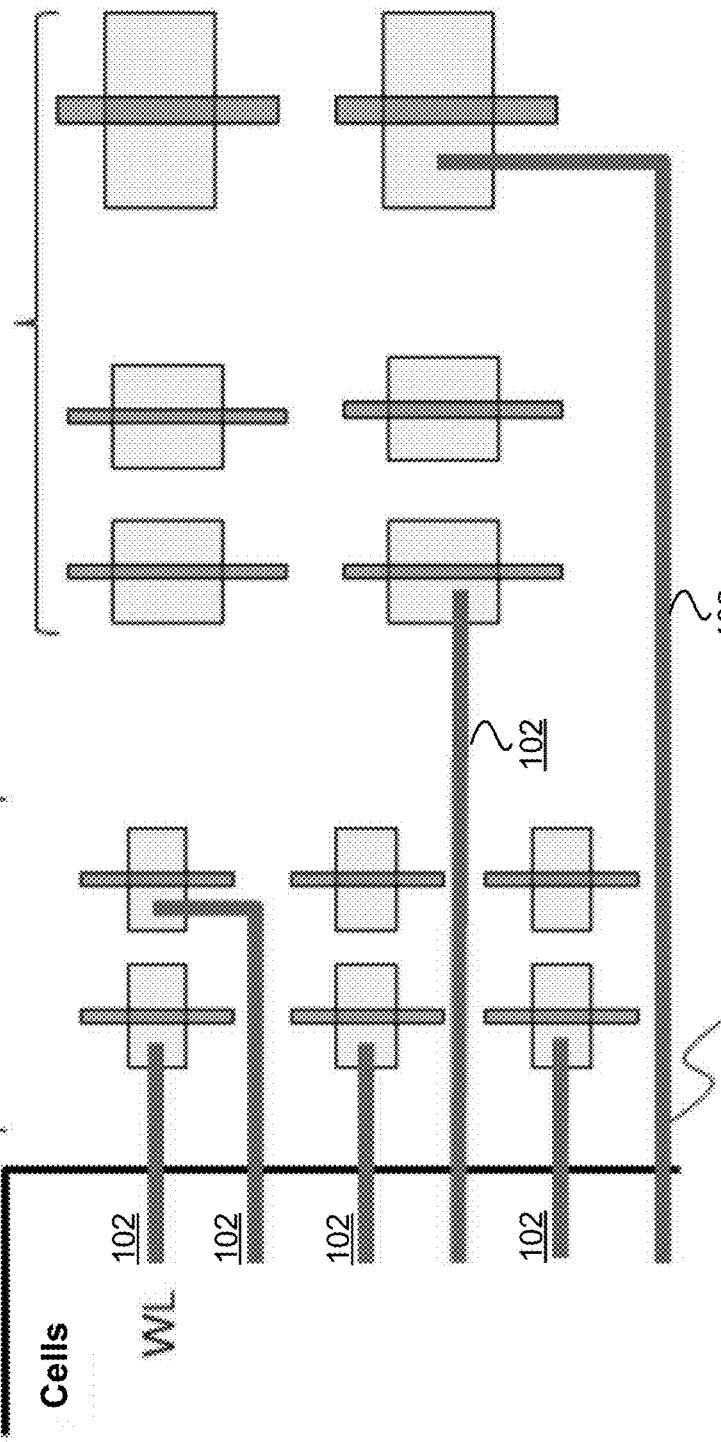
Figure 3C:
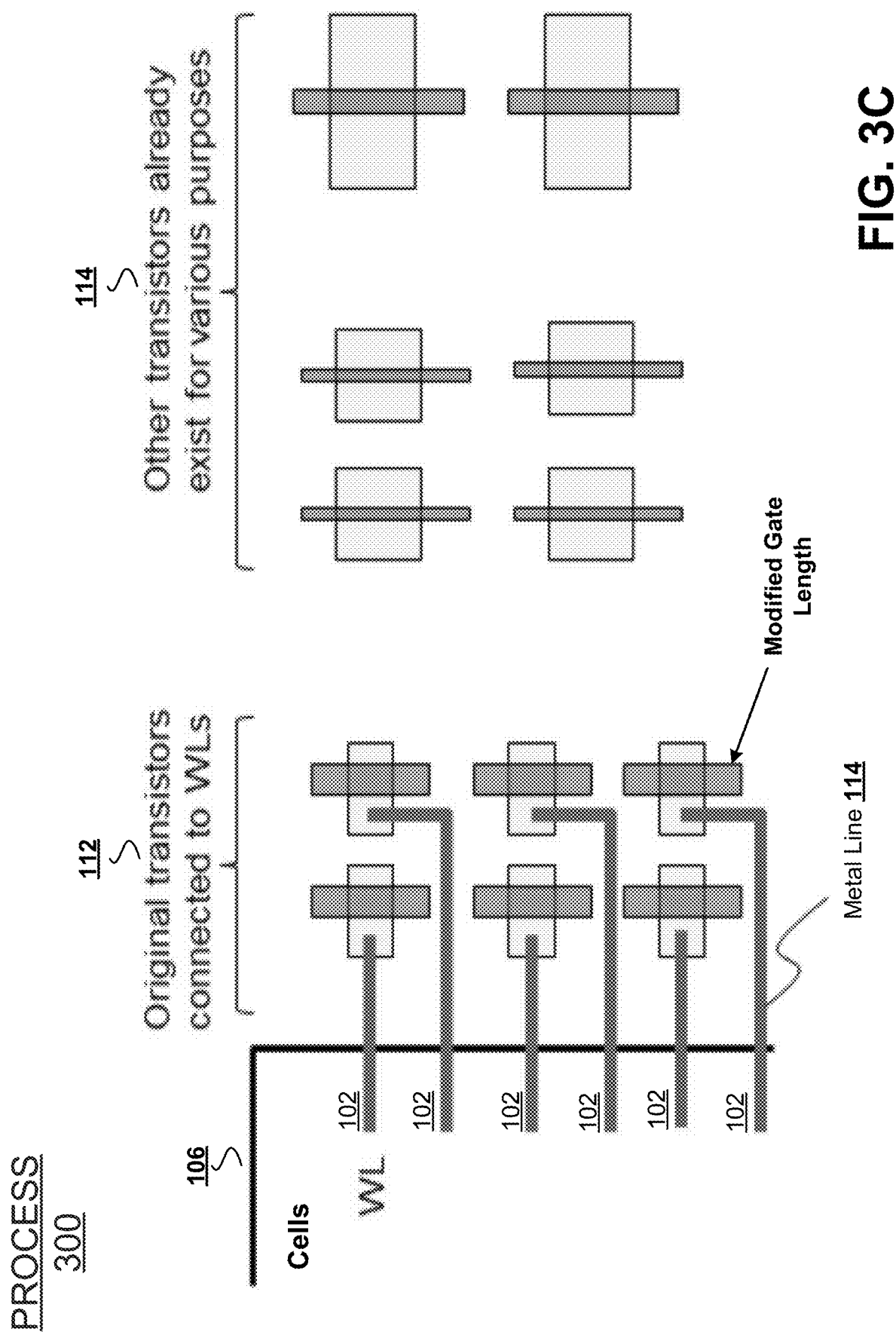

FIGS. 3A-3C depict an example embodiment of a process for direct memory characterization using a plurality of periphery transistors stages for testing purposes in accordance with the techniques described in this disclosure. The illustrated embodiment in FIG. 3A shows memory cells 106 having WLs 102 connected with the original driving transistors 112 (periphery transistors) via metal routing lines 115 as well as other periphery transistors 114 already existing on the product chip for various purposes. Process 300 continues on FIG. 3B which shows some of the original WLs 102 have been disconnected from the original driving transistors 112 and connected instead with the other periphery transistors 114. This can be performed using a revised or specially constructed mask layer that includes the routing to the other periphery transistors 114 using metal routing lines 115 as shown. At the mask revision, some of WLs 102 remain connected to the original transistors 112 for comparison, and others are connected to different types of transistors for evaluation.

Process 300 continues to FIG. 3C. After testing is conducted and the periphery transistor characteristics have been identified that provide the most suitable conditions for the memory cells 106, the product chip can be manufactured using the optimized transistor characteristics for the original driving transistors 112 connected with the WLs 102 of the memory array. If the test results indicate favorable conditions for a longer gate length for the transistors, then the gate length of the WL driver transistors in the final product can be manufactured using an increased gate length as long as the layout space on the chip permits. Indeed, in certain aspects the parasitic capacitance and/or leakage currents can be made Design of Experiment ("DOE") with varying the layout properties of the periphery transistors to confirm an acceptable capacitance and/or junction leakage level with the layout properties of the transistors. The layout properties can include transistor source area, junction profile, transistor gate width and/or gate oxide thickness etc. In this example, a modified gate length for the original periphery transistors 112—in particular, a larger gate length—was determined during the evaluation and used in manufacturing the final product chip. The metal lines 114 are shown connected back to the modified original driving transistors 112 for the WLs 102 of the memory array. This completes process 300 in accordance with one example embodiment.

Figure 4:
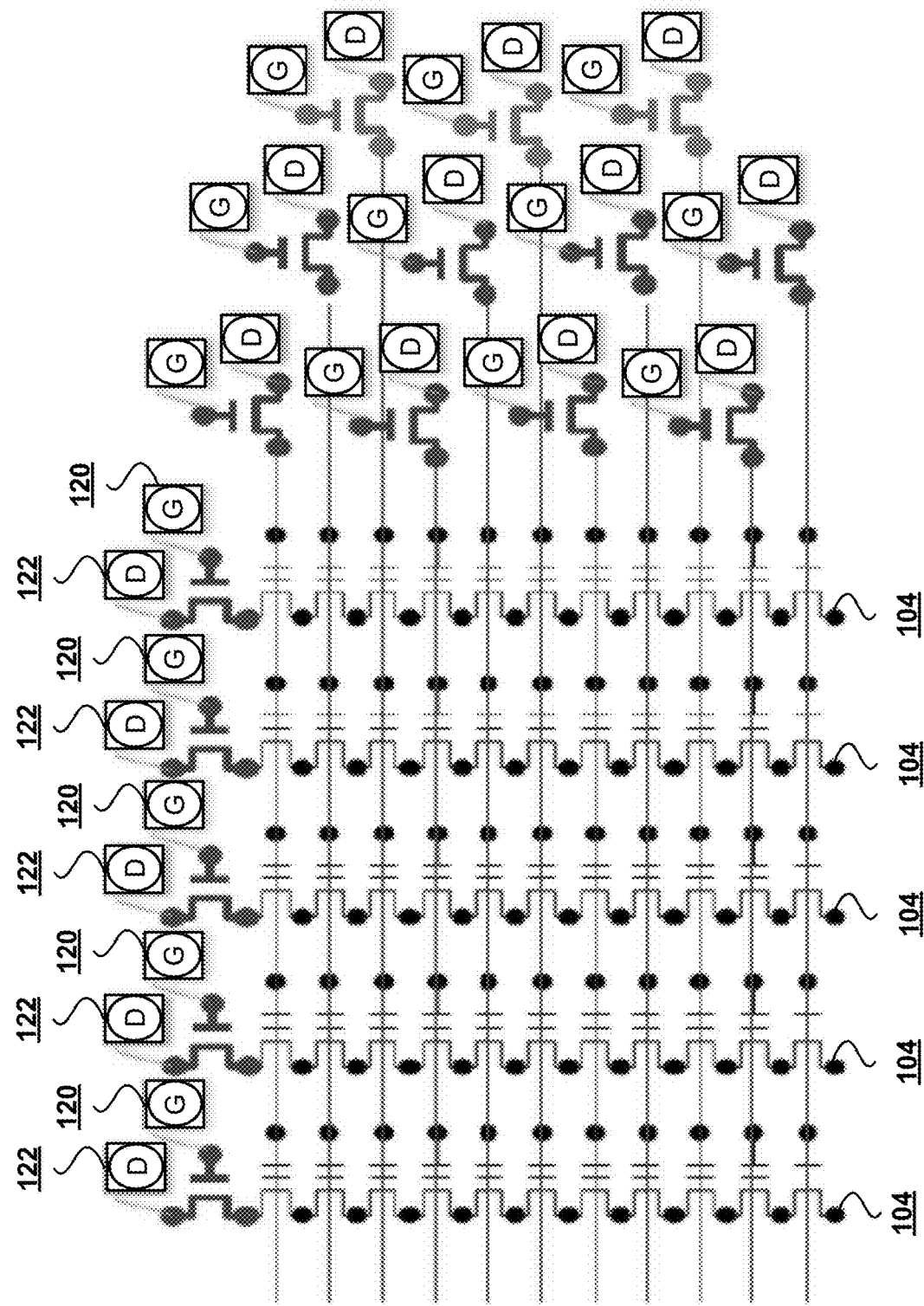
FIG. 4 depicts a conceptual diagram of an example embodiment of a memory array having WL pads and BL pads replaced by a plurality of periphery transistors for testing purposes in accordance with the techniques described in this disclosure.

The techniques descried above with respect to the WLs 102 of the memory array can be used in the same manner for the BLs 104 of the memory array. FIG. 4 depicts a conceptual diagram of an example embodiment of a memory array having WL pads and BL pads replaced by a plurality of periphery transistors for testing purposes in accordance with the techniques described in this disclosure. In this example, memory array 400 includes periphery transistors of Type 1 connected with the WLs 102 and BLs 104. In particular, the Type 1 periphery transistors connected with the BLs 104 include their own gate probe pads 120 and drain probe pads 122 used for testing purposes in accordance with the techniques described in this disclosure.

Figure 5:
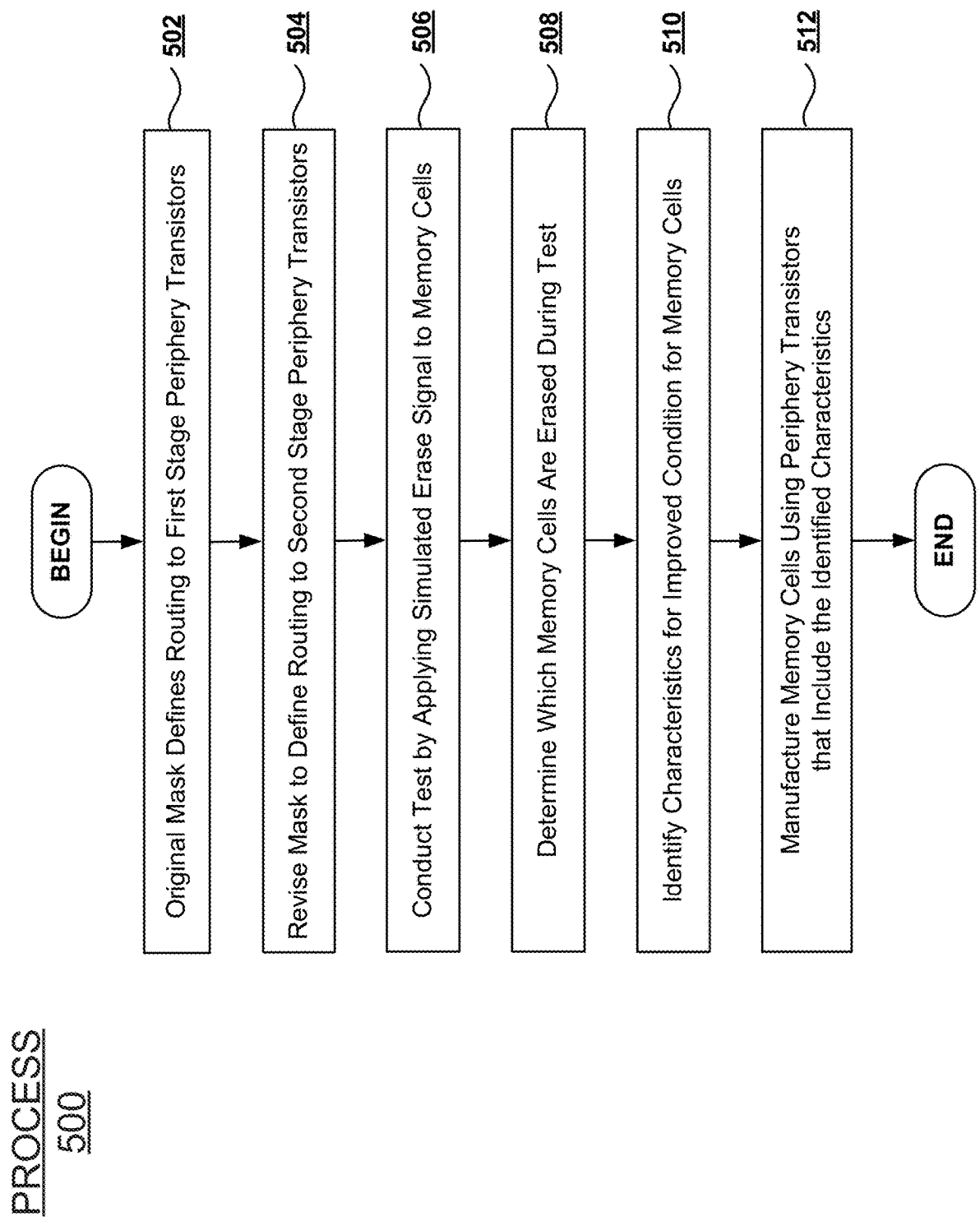
FIG. 5 depicts a conceptual flow chart depicting an example embodiment of a process for direct memory characterization using periphery transistors in accordance with the techniques described in this disclosure.

FIG. 5 depicts a conceptual flow chart depicting an example embodiment of a process for direct memory characterization using periphery transistors in accordance with the techniques described in this disclosure. It is noted that the process described below is exemplary in nature and are provided for illustrative purposes and not intended to limit the scope of the disclosure to any particular example embodiment. For instance, methods in accordance with some embodiments described in this disclosure may include or omit some or all of the operations described below or may include steps in a different order than described in this disclosure. The particular methods described are not intended to be limited to any particular set of operations exclusive of all other potentially intermediate operations. In addition, the operations may be embodied in computer-executable code, which may cause a general-purpose or special-purpose computer hardware to perform operations. In other instances, these operations may be performed by specific hardware components or hardwired circuitry, or by any combination of programmed computer components and custom hardware circuitry.

In at least certain embodiments, process 500 refers to the elements and components described above with respect to FIGS. 2A-2B and 3A-3B including a memory array fabricated on a semiconductor substrate comprising a plurality of nonvolatile memory cells 106 electrically connected with a plurality of WLs 102 and BLs 104 arranged such that each memory cell 106 is disposed at an intersecting one of the WLs 102 and BLs 104 and arranged in a cross-point configuration. The memory array may be fabricated on the semiconductor substrate using a mask layer defining the routing configuration that electrically connects each WL 102 with a source (or drain) of one of a plurality of first stage periphery transistors that is used for driving the Program, Erase and Read signals out to the memory cells 106 in the memory array.

Process 500 begins at operation block 502 wherein the original mask layer defines the routing on an existing product chip from the first stage periphery transistors (e.g., driving periphery transistors 112 of FIGS. 3A-3B) to the memory cells 106. This routing includes connections between the driving periphery transistors 112 and the gate terminals of the memory cells 106 in the memory array. Once the existing product goes into testing, at operation 504 a revised mask can be used to define new routing for some or all of the WLs 102 so that they connect with a set of second stage periphery transistors (e.g., transistors 114 of FIGS. 3A-3B) already existing on the product chip for various purposes that may be unrelated to testing. This may include a specially constructed mask layer or a revised mask layer that defines the second routing configuration for electrically connecting a group of one or more of the word lines of the memory array with one the second stage periphery transistors.

In one aspect, the second routing configuration is different from the first routing configuration. The second periphery transistors may include one or more characteristics different from the corresponding characteristics of the first stage periphery transistors. The first and second stage periphery transistors each have a gate region electrically connected with a gate probe pad and/or a drain (or source) probe pad.

Process 500 continues at operation 506 wherein one or more tests are conducted on the memory cells of the memory array based on applying a test probe to one or more of the gate pads and/or drain (or source) pads of the first and second stage periphery transistors. In one embodiment, the test may include (1) applying a simulated Erase signal to the nonvolatile memory cells on the WLs 102 of the memory array via the first and second stage periphery transistors, and (2) determining which of the nonvolatile memory cells are erased during the test. Based on the results of this test, either the erased cells were supposed to be erased, and hence are acceptable, or were supposed to be erase-inhibited, and hence a memory failure has occurred. This determination is made in process 500 at operation 508.

Process 500 continues to operation 510 whereby the information obtained from the one or more tests can then be used to identify characteristics of the first and/or second stage periphery transistors that provide one or more improved conditions for the nonvolatile memory cells in the memory array. In one embodiment, the improved conditions may include reduced gate capacitance and/or junction capacitance level for the modified periphery transistors and the identified characteristics may be adapted to reduce the gate capacitance and/or junction capacitance level associated with the nonvolatile memory cells. The improved conditions may also include reduced leakage currents in the modified periphery transistors and the identified characteristics may be adapted to reduce the leakage currents associated with the modified periphery transistors.

Process 500 then continues to operation 512 wherein the memory array of nonvolatile memory cells can be manufactured using modified versions of the first stage periphery transistors (e.g., driving transistors 112 of FIGS. 3A-3B) to incorporate the transistor characteristics that were identified during the test as providing the improved condition(s) in the nonvolatile memory cells. The characteristics of the periphery transistors may include transistor type, transistor source area, junction profile, gate capacitance and/or junction capacitance, gate width and length, doping profile, channel width, channel length, transistor width-to-length (W/L) ratio, and/or gate oxide thickness, etc. Persons of ordinary skill in the art would recognize the various characteristics of transistors that can be tested.

In one embodiment, the nonvolatile memory cells may comprise Flash memory cells or other floating gate configurations. For example, the nonvolatile memory cells may comprise NAND Flash memory. NAND Flash uses floating-gate transistors connected in a way that resembles a NAND gate: several transistors are connected in series and the BL can be pulled low only if all the WLs are pulled high.

In one embodiment, the test probe may comprise a multi-channel parametric testing device supporting more than 256 channels. In one embodiment, the second routing configuration for the second stage periphery transistors bypasses the word line connections of the first stage periphery transistors. The gate capacitance and/or junction capacitance level of the periphery transistors is small compared to a capacitance level of the word line pads used in conventional testing. The modified periphery transistors may be adapted to generate a high impedance (Hi-Z) condition to isolate the plurality of memory cells from parasitic capacitances or inductances introduced by the test probe. In one embodiment, the BLs 104 of the memory array are used instead of, or in addition to, the WLs 102 of the memory array. This completes process 500 in accordance with one example embodiment.

Embodiments of the present disclosure may be practiced using various computer systems including hand-held devices, microprocessor systems, programmable electronics, laptops, tablets and the like. The embodiments can also be practiced in distributed computing environments where tasks are performed by remote processing devices that are linked through one or more wire-based or wireless networks. A hardware and/or software module may be implemented mechanically, electronically, or any suitable combination thereof. Computer hardware may include dedicated circuitry or logic that is permanently configured to perform certain operations. For example, a hardware module may be a special-purpose processor, such as a Field Programmable Gate Array ("FPGA") or an Application Specific Integrated Circuit ("ASIC"), Programmable Logic Device ("PLD"), etc. Computer hardware module may also include programmable logic or circuitry that is temporarily configured by software to perform operations. For example, computer hardware may include software executed by a general-purpose processor or other programmable processor. Once configured by such software, hardware modules may become specific machines (or specific components of a machine) tailored to perform one or more configured functions.

It will be appreciated by persons of skill in the art that the decision to implement a hardware module mechanically in dedicated and permanently configured circuitry or in temporarily configured circuitry (e.g., configured by software) may be driven by cost and time considerations. Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain of the operations described in this disclosure.

Similarly, the functions described in this disclosure may be at least partially processor implemented, with a particular processor or processors being an example of computer hardware. For example, at least some of the operations described herein may be performed by one or more processors or processor-implemented hardware modules. Moreover, the one or more processors may also operate to support performance of the relevant operations in a cloud computing environment or as software as a service ("SaaS"). In addition, at least some of the operations may be performed by a group of computers (as examples of machines including processors), with these operations being accessible via a network (e.g., the Internet) and via one or more appropriate interfaces, e.g., an application programming interface ("API").

FIG. 6 depicts an example overview block diagram of a system upon which the embodiments described in this disclosure may be implemented. It is to be understood that a variety of computers configurations may be used to implement the described techniques. While FIG. 6 illustrates various components of a system 600, it is not intended to represent any particular architecture or manner of interconnecting components. It will also be appreciated that network computers and other data processing systems, which have fewer components or additional components, may be used. System 600 may, for example, comprise a workstation, personal computer, laptop computer, tablet, smartphone, or other hand-held wireless device, or any device having related functionality.

In the illustrated embodiment, system 600 includes a computer system 610. Computer system 610 includes an interconnect bus 605 (or other communication mechanism for communicating information) and one or more processor(s) 601 in communication with the interconnect bus for processing information. Computer system 610 also includes a memory system 602 in communication with the one or more processors 601 via the interconnect bus. Memory system 602 may be configured to store information and instructions to be executed by the processor 601, including information and instructions for performing the innovative techniques described above. This memory system 602 may also be used for storing programs executed by the processor(s) 601. Possible implementations of this memory system may be, but are not limited to, static or dynamic random access memory (RAM), read only memory (ROM), or combination thereof.

In the illustrated embodiment, a storage device 603 is also provided for storing information and instructions. A typical storage device 603 may comprise nonvolatile memory. Common forms of storage devices include, for example, a hard drive, a magnetic disk, an optical disk, a CD-ROM, a DVD, a flash or other non-volatile memory, a USB memory card, or any other non-transitory computer-readable medium from which a computer can access data and instructions. Storage device 603 may store source code, binary code, or software files for performing the techniques described above. In addition, while FIG. 6 shows that storage device 603 as a local device connected with the components of the system, it will be appreciated by persons skilled in the art that the described techniques may use a storage device remote from the system, such as a database or other network storage device coupled with the computer system 610 through a one or more network interface(s) 604.

The network interface(s) 604 may provide communications between the computer system 610 and network(s) 620. The network interface 604 may be any wireless or wired connection, or any combination thereof. Computer system 610 may further be configured to send and receive information through the network interface(s) 604 across one or more networks 620 such as a local area network (LAN), wide-area network (WAN), wireless or Bluetooth network, or the Internet 630, etc. Computer system 610 may access data and features on systems residing on one or multiple different computer hardware servers 631-634 across the network(s) 620. The computer hardware servers 631-634 and associated software (not shown) may also reside in a cloud-computing environment.

Storage device 603 and memory system 602 are both examples of non-transitory computer readable storage media. Embodiments in this disclosure can be embodied in computer-readable code stored on any computer-readable medium, which when executed by a computer or other data processing system, can be adapted to cause the system to perform operations according to the techniques described in this disclosure. Computer-readable media may include any mechanism that stores information in a form accessible by a data processing system such as a computer, network device, tablet, smartphone, or any device having similar functionality. Examples of computer-readable media include any type of non-transitory, tangible media capable of storing information thereon, including hard drive disks ("HDDs"), solid-state devices ("SSDs") or other flash memory, optical disks, digital video disks ("DVDs"), CD-ROMs, magnetic-optical disks, ROMs, RAMs, erasable programmable read only memory ("EPROMs"), electrically erasable programmable read only memory ("EEPROMs"), magnetic or optical cards, or any other type of media suitable for storing data and instructions in an electronic format. Computer-readable media can also be distributed over a networked computer system stored and executed in a distributed manner.

Further, computer system 610 may comprise a display 612 for displaying information to a computer user. An input device 611 such as a keyboard, touchscreen, and/or mouse may also be coupled to the interconnect bus 605 for communicating information and commands via processor 601. In some systems, the interconnect bus 605 may represent multiple specialized interconnect buses. The combination of these components allows the user to communicate with the system. With these embodiments in mind, it will be apparent from this description that aspects of the described techniques may be embodied, at least in part, in software, hardware, firmware, or any combination thereof.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the following claims.

What is claimed is:

1. A method comprising:
    in a memory array fabricated on a semiconductor substrate comprising a plurality of nonvolatile memory cells electrically connected with a plurality of word lines and bit lines arranged in the memory array such that each memory cell is disposed at an intersecting one of the word lines and bit lines, the memory array fabricated on the semiconductor substrate using a mask layer defining a first routing configuration wherein each word line is electrically connected with one of a plurality of first stage periphery transistors:
    revising the mask layer to define a second routing configuration different from the first routing configuration, the second routing configuration for electrically connecting a group of one or more of the word lines of the memory array with one of a plurality of second stage periphery transistors that include one or more characteristics different from corresponding characteristics of the first stage periphery transistors, the first and second stage periphery transistors each comprising a gate region electrically connected with a gate pad and a source or drain region electrically connected with a source or drain pad;
    conducting a test based on applying a test probe to one or more of the gate pads and source or drain pads of the plurality of first and second stage periphery transistors, the test including:
    (1) applying a simulated erase signal to the nonvolatile memory cells on the word lines of the memory array via the first and second stage periphery transistors; and
    (2) determining which of the nonvolatile memory cells are erased during the test; and
    based on the results of the test, identifying one or more characteristics that provides an improved condition for the nonvolatile memory cells in the memory array.

2. The method of claim 1 wherein the memory array is manufactured using modified versions of the plurality of first stage periphery transistors that each incorporate the identified characteristics providing the improved condition of the nonvolatile memory cells.

3. The method of claim 2 wherein the improved condition includes a reduced gate capacitance and/or junction capacitance level for the modified versions of the first stage periphery transistors, wherein the identified characteristics are adapted to reduce the gate capacitance and/or junction capacitance level associated with the first stage periphery transistors.

4. The method of claim 2 wherein the improved condition includes a reduced leakage current for the modified versions of the first stage periphery transistors, wherein the identified characteristics are adapted to reduce the leakage current associated with the first stage periphery transistors.

5. The method of claim 2 wherein the modified periphery transistors are adapted to generate a high impedance (Hi-Z) condition isolating the plurality of memory cells from parasitic capacitances or inductances introduced by the test probe.

6. The method of claim 1 wherein characteristics of periphery transistors include transistor type, transistor source area, junction profile, gate capacitance, gate width and length, doping profile, transistor width to length (W/L) ratio and gate oxide thickness.

7. The method of claim 1 wherein an identified characteristic includes a transistor width to length (W/L) ratio that varies for different periphery transistors.

8. The method of claim 1 wherein the nonvolatile memory cells comprise NAND Flash memory cells.

9. The method of claim 1 wherein the test probe comprises a multi-channel parametric testing device supporting more than 256 channels.

10. The method of claim 9 wherein gate capacitance and/or junction capacitance level of the second stage periphery transistors is small compared to a capacitance level of the word line pads used in conventional testing.

11. The method of claim 1 wherein the second routing configuration for the second stage periphery transistors bypasses the word line connections of the first stage periphery transistors.

12. The method of claim 1 wherein the method is performed on the bit lines of the memory array instead of, or in addition to, the word lines of the memory array.

13. A nontransitory computer readable medium adapted for storing programmed computer code executable by a computer processor to perform operations, the operations comprising:
in a memory array fabricated on a semiconductor substrate comprising a plurality of nonvolatile memory cells electrically connected with a plurality of word lines and bit lines arranged in the memory array such that each memory cell is disposed at an intersecting one of the word lines and bit lines, the memory array fabricated on the semiconductor substrate using a mask layer defining a first routing configuration wherein each word line is electrically connected with one of a plurality of first stage periphery transistors:
revising the mask layer to define a second routing configuration different from the first routing configuration, the second routing configuration for electrically connecting a group of one or more of the word lines of the memory array with one of a plurality of second stage periphery transistors that include one or more characteristics different from corresponding characteristics of the first stage periphery transistors, the first and second stage periphery transistors each comprising a gate region electrically connected with a gate pad and a source or drain region electrically connected with a source or drain pad;
conducting a test based on applying a test probe to one or more of the gate pads and source or drain pads of the plurality of first and second stage periphery transistors, the test including:
(1) applying a simulated erase signal to the nonvolatile memory cells on the word lines of the memory array via the first and second stage periphery transistors; and
(2) determining which of the nonvolatile memory cells are erased during the test; and
based on the results of the test, identifying one or more characteristics that provides an improved condition for the nonvolatile memory cells in the memory array.

14. The nontransitory computer readable medium of claim 13 wherein the memory array is manufactured using modified versions of the plurality of first stage periphery transistors that each incorporate the identified characteristics providing the improved condition of the nonvolatile memory cells.

15. The nontransitory computer readable medium of claim 14 wherein the improved condition includes a reduced gate capacitance and/or junction capacitance level for the modified versions of the first stage periphery transistors, wherein the identified characteristics are adapted to reduce the gate capacitance and/or junction capacitance level associated with the first stage periphery transistors.

16. The nontransitory computer readable medium of claim 14 wherein the improved condition includes a reduced gate capacitance and/or junction capacitance level for the modified versions of the first stage periphery transistors, wherein the identified characteristics are adapted to reduce the gate capacitance and/or junction capacitance level associated with the first stage periphery transistors.

17. The nontransitory computer readable medium of claim 14 wherein characteristics of periphery transistors include transistor type, transistor source area, junction profile, gate capacitance, gate width and length, doping profile, transistor width to length (W/L) ratio and gate oxide thickness.

18. The nontransitory computer readable medium of claim 13 wherein the nonvolatile memory cells comprise NAND Flash memory cells.

19. The nontransitory computer readable medium of claim 13 wherein the second routing configuration for the second stage periphery transistors bypasses the word line connections of the first stage periphery transistors.

20. The nontransitory computer readable medium of claim 13 wherein the method is performed on the bit lines of the memory array instead of, or in addition to, the word lines of the memory array.

* * * * *